United States Patent
Herrera et al.

(10) Patent No.: US 6,621,319 B1
(45) Date of Patent: Sep. 16, 2003

(54) EDGE-TRIGGERED TOGGLE FLIP-FLOP CIRCUIT

(75) Inventors: Ruben Herrera, New York, NY (US); Rahul Sarpeshkar, Cambridge, MA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/407,535

(22) Filed: Sep. 29, 1999

(51) Int. Cl.⁷ .................................. H03K 3/037
(52) U.S. Cl. ............................. 327/221; 327/199
(58) Field of Search ......................... 327/199, 208, 327/210, 211, 212, 214, 215–223, 225

(56) References Cited

U.S. PATENT DOCUMENTS

| | | | | |
|---|---|---|---|---|
| 4,228,370 A | * | 10/1980 | Milburn, Jr. | 327/215 |
| 4,508,980 A | * | 4/1985 | Puar | 327/57 |
| 4,680,482 A | * | 7/1987 | Obara | 327/212 |
| 4,803,386 A | * | 2/1989 | Kraus et al. | 327/55 |

* cited by examiner

Primary Examiner—Toan Tran
(74) Attorney, Agent, or Firm—Harness, Dickey & Pierce, P.L.C.

(57) ABSTRACT

An edge-triggered flip-flop circuit in which a pair of capacitors are alternately charged and discharged to voltages approximating supply rail values and, in combination of with a small number of switches, present high or low impedance paths for input signal transitions of a predetermined polarity to trigger state changes. In an alternative embodiment large switching capacitors are avoided in a circuit that employs a pair of pass-transistor configurations to connect respective capacitors to output terminals of a bistable device. The voltages on the capacitors track the corresponding bistable device output voltages when the input signal is in a given state (illustratively low), and store the value of the corresponding voltage when turned off by the (illustratively high) other state of the input signal. Then, the voltage on the capacitors and the selected input signal transition is used to effectively trigger a transition in the bistable device.

8 Claims, 6 Drawing Sheets

EDGE-TRIGGERED TOGGLE FLIP-FLOP CIRCUIT

RELATED APPLICATIONS

Subject matter relating to that of the present application is presented in U.S. Patent applications filed on the same day as this application: "Spiking Neuron Circuit" by R. Sarpeshkar; and "Spike-Triggered Asynchronous Finite State Machine," by R. Herrera and R. Sarpeshkar. These applications are assigned to the assignee of the present application and are hereby incorporated by reference in the present application.

FIELD OF THE INVENTION

The present invention relates to electronic circuits, and, more particularly to bi-stable circuits for use as digital building block circuits used in electronic systems. Still more particularly, embodiments of the present invention relate to edge-triggered toggle flip-flop circuits.

BACKGROUND OF THE INVENTION

Flip-flop circuits, including edge-triggered toggle flip-flops, are used as building blocks in many digital systems including counters, parity detectors, and registers. In response to each positive/negative edge of an input, usually referred to as the clock, the flip-flop changes its state: It toggles from a '0' to a '1', or from a '1' to a '0'.

The prior art has used a number of techniques to avoid constant oscillatory behavior after the input edge has passed. Thus, for example, conventional toggle flip flops are configured so that each edge of a toggle input generates a brief input pulse that is of just the right duration so that the flip flop has sufficient time to change state only once. This strategy proves unreliable, since it relies on a high degree of accuracy in pulse timing. Alternatively, two bistable elements are sometimes configured in a "master-slave" feedback-loop configuration such that one bistable element is written on one phase of the clock signal while the other holds its state and vice versa. This second strategy is reliable but inefficient in its use of circuit area in integrated circuit (IC) chip implementations, since it requires two bistable elements and a number of logic gates for its operation.

SUMMARY OF THE INVENTION

The present invention overcomes limitations of the prior art and achieves a technical advance in providing a novel edge-triggered flip-flop circuit that is reliable in its operation and efficient in its use of IC chip area. Illustrative embodiments of the present invention use only one bistable element and some simple transistor-level logic for its operation.

In a first illustrative embodiment, capacitors are alternately charged and discharged to voltages approximating supply rail values and, in combination with a small number of switches, present high or low impedance paths for input signal transitions of a predetermined polarity (illustratively positive-going), thereby to selectively communicate pulses to switches capable of initiating state transitions in a bistable element.

An alternative embodiment of the present invention provides a flip flop circuit with reduced power requirements that proves useful in a variety of low-power applications. More specifically, potentially high power consumption of large switching capacitors is avoided in a circuit that employs a pair of pass-transistor configurations to operate as switches responding to the input signal (and its complement) to connect respective capacitors to output terminals of a bistable device. In operation, the voltage on the capacitors track the corresponding output voltages when the input signal is in a given state (illustratively low), and store the value of the corresponding voltage when turned off by the (illustratively high) other state of the input signal. Then, the voltage on the capacitors and the selected input signal transition are used to effectively trigger a transition in the bistable device.

BRIEF DESCRIPTION OF THE DRAWINGS

The above-summarized invention will be understood more completely upon a consideration of the following detailed description read in light of the included drawing, wherein.

DETAILED DESCRIPTION

Figure 1:
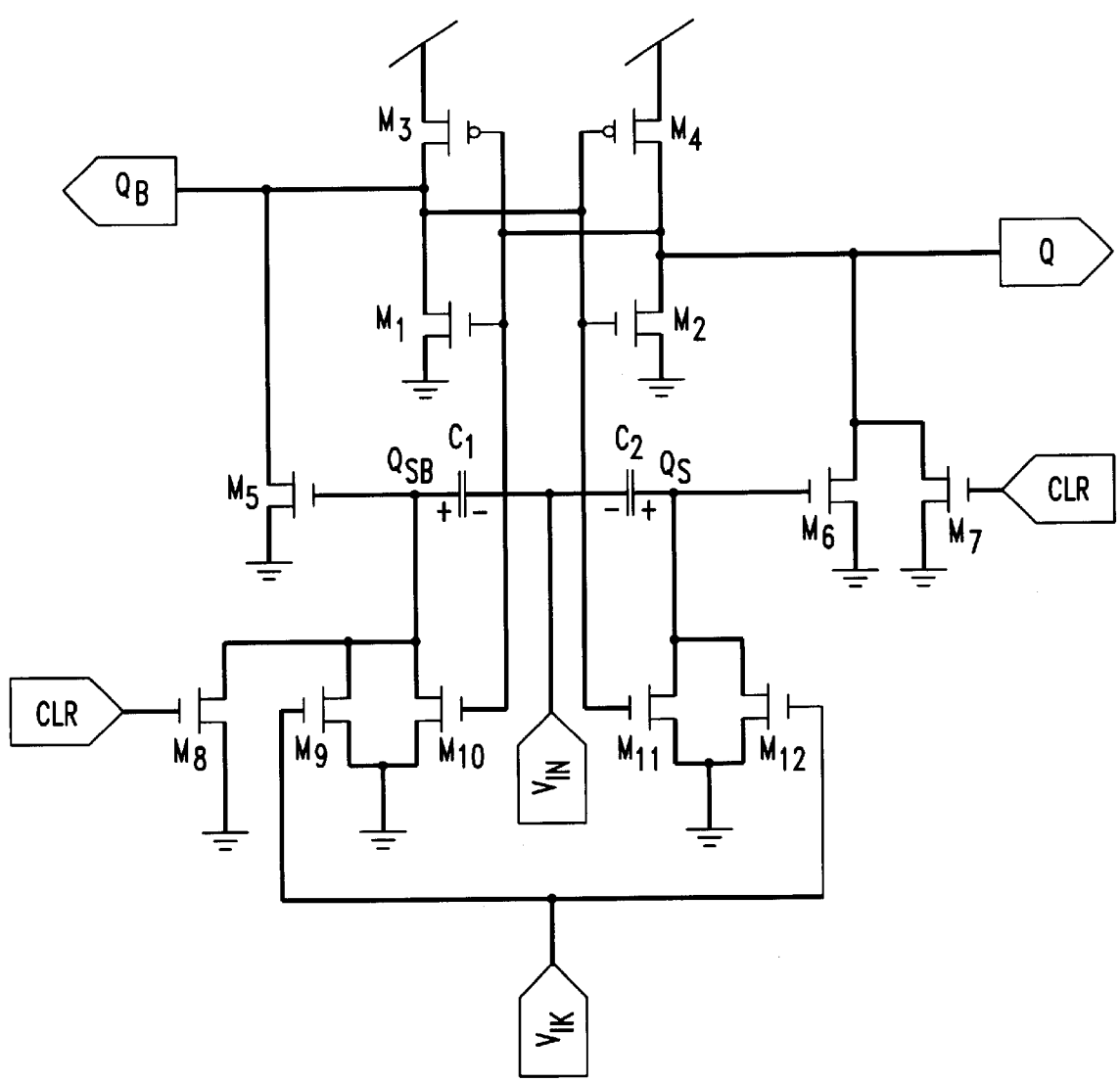
FIG. 1 is a circuit diagram of a first illustrative embodiment based on the present inventive teachings.

FIG. 1 is a circuit diagram of a first illustrative embodiment based on the present inventive teachings. In FIG. 1 and elsewhere in the present detailed description, transistors $M_i$ and capacitors $C_x$, for all i and x, are of standard design suitable for manufacture in accordance with a variety of standard processes. Advantageously, CMOS MOSFET designs are employed, but any of PMOS, NMOS, or a combination of these and other types of devices may be employed to advantage in particular contexts. In keeping with standard practice, illustrative p-channel devices (such as $M_3$) include a "bubble" on the gate, denoting a device that turns on as the gate is made more negative relative to the source. Likewise, the positive power supply is normally positioned at the top of diagrams, with negative voltages at the bottom. (Power supply voltages in circuit diagrams herein will be referred to as $V_{DD}$, with ground being the reference voltage.) So, sources of p-channel devices are at the top, while sources for n-channel devices (such as $M_0$) are at the bottom. See generally, J. Rabaey, *Digital Integrated Circuits*, Prentice Hall, N.J., 1996; and C. Mead, *Analog VLS1 and Neural Sysems*, Addison-Wesley, Reading M.A., 1989, especially chapter 3.

Returning to FIG. 1, transistors $M_1$ and $M_3$ form an inverter, as do the transistors $M_2$ and $M_4$. These two inverters are crosscoupled to form a classic bistable element often referred to as a latch, which latch is arranged to provide outputs Q and $Q_b$. Transistors $M_5$ and $M_6$ serve to set the state of the latch to '1' (i.e., the voltage of Q very close to $V_{DD}$) or to '0' (the voltage of Q very close to ground), respectively. Transistors $M_5$ and $M_6$ advantageously have a W/L-ratio that is large enough to overwhelm the current from $M_3$ or $M_1$. It will be appreciated that transistors $M_5$ and $M_6$ compete with each other in setting the latch to a '1' or '0' state; robust setting of the latch is achieved if one of the $Q_5$ or $Q_{sb}$ voltages is near $V_{DD}$ while the other voltage is near ground.

If the latch is currently in the '1' state (Q near $V_{DD}$), transistor $M_{10}$ is activated, and voltage at $Q_{sb}$ (on the positive side of capacitor $C_1$) is discharged to ground; further, because $M_{10}$ is strongly activated, any capacitive coupling of the input $V_{in}$ from $C_1$ is weak. In contrast, in the '1' state, the $M_1$ transistor is inactive because node $Q_b$ is near ground, the $Q_s$ node is in a high-impedance state, and any capacitive coupling of the input $V_{in}$ from $C_2$ (chosen to be near $C_1$ in capacitance) is strong. Thus, in the '1' state, a positive-going edge from the input will activate $M_6$ and reset the latch to '0'.

Similarly, when the latch of FIG. 1 is in the '0' state (voltage at $Q_b$ is near $V_{DD}$), a positive edge at the input $V_{in}$ will activate $M_5$ and reset the latch to '1'. Thus, the state of the latch toggles between a '1' and '0' in response to a sequence of positive-going edges at $V_{in}$. It should be noted that as soon as the latch changes state, it inactivates whichever of the $Q_s$ or $Q_{sb}$ nodes caused it to change state, thus resetting both nodes to ground after a state change has occurred. See FIGS. 3A–E.

Figure 3A:
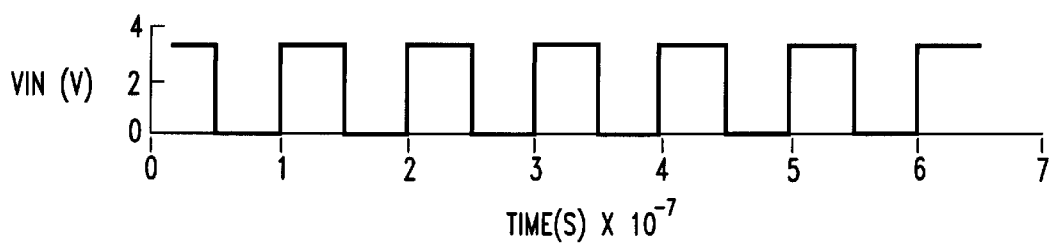
FIG. 3 shows additional waveforms relating to the circuit of FIG. 1.
Figure 3B:
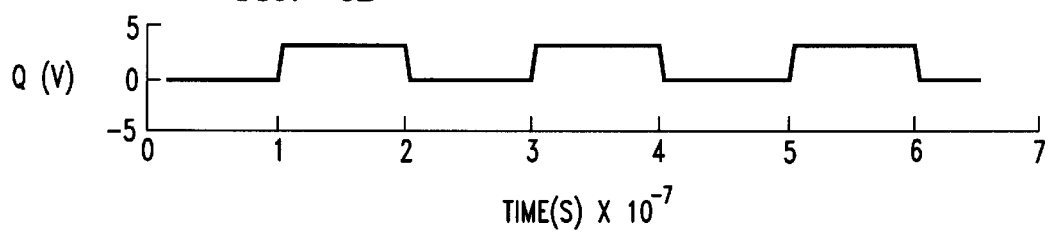
Figure 3C:
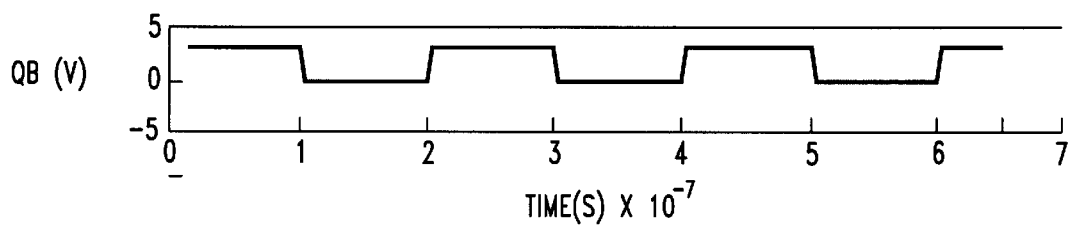
Figure 3D:
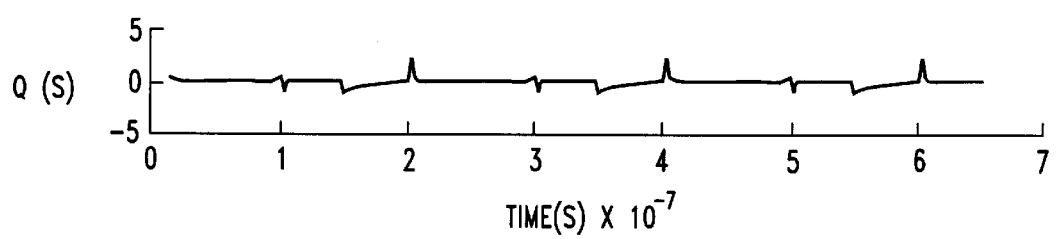
Figure 3E:
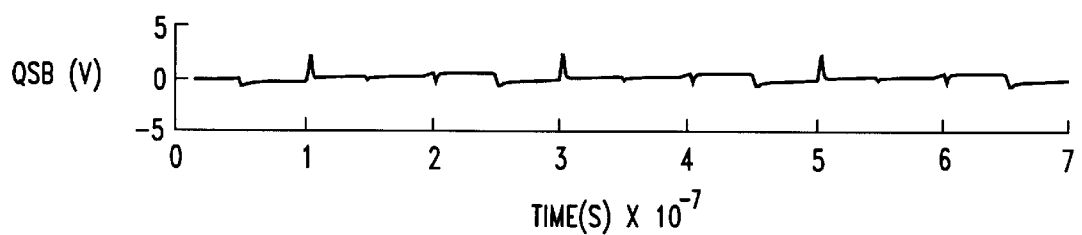

The transistors $M_9$ and $M_{12}$ are advantageously weakly turned on with a constant voltage $V_{lk}$ so as to prevent large negative excursions in the $Q_{sb}$ or $Q_s$ voltages from occurring whenever a negative edge is coupled from the input to a high-impedance node. As shown in FIGS. 3D and 3E, negative edges in the input signal, $V_{in}$, have no effect in the circuit apart from causing small negative transients at the $Q_s$ or $Q_{sb}$ nodes. The transistors $M_8$ and $M_7$ perform an asynchronous clear function and reset the state of the flip flop to '0' whenever the clear input is near $V_{DD}$. When the clear input is active, $M_7$ resets Q to zero, which causes $Q_b$ to go high and reset $Q_s$ to zero; the transistor $M_8$ resets $Q_{sb}$ to zero.

Figure 2A:
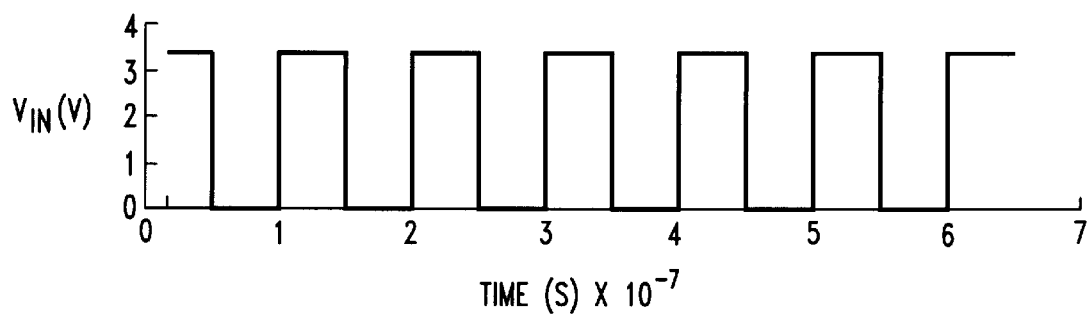
FIG. 2 shows input-output waveforms useful in understanding the operation of the circuit of FIG. 1.
Figure 2B:
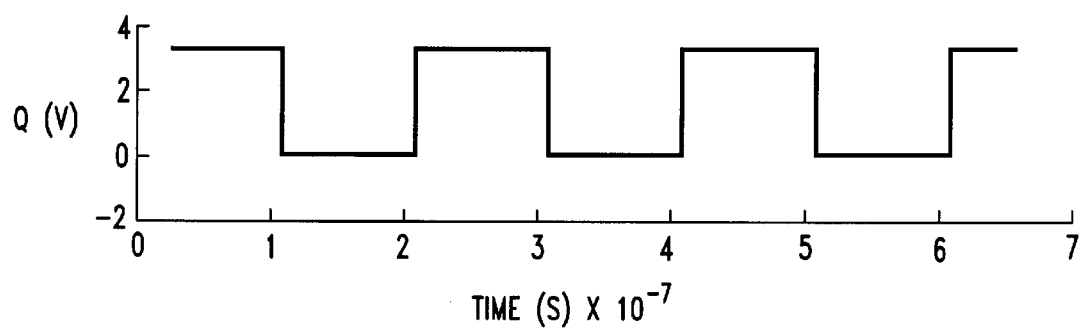
Figure 2C:
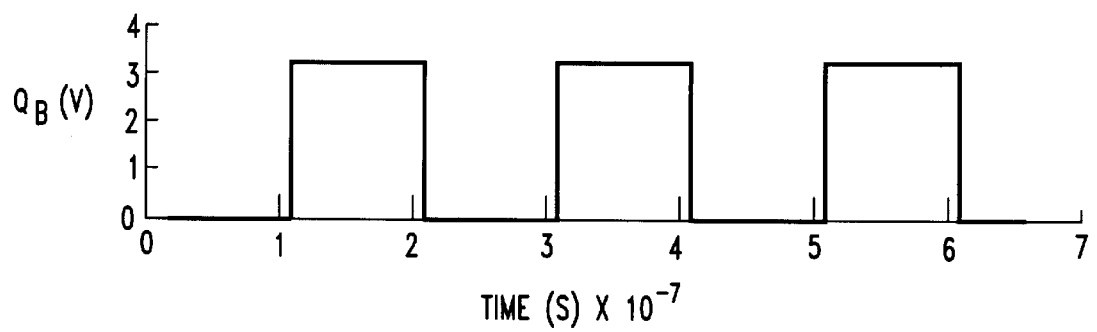

FIG. 2 shows waveforms occurring during operation of the circuit of FIG. 1 for the case of devices designed for a 0.5 µm manufacturing process with $V_{DD}$=3.3V, $V_{lk}$=0.9V, and $C_1$=$C_2$=0.1 pF. Note that, on every positive edge of the input $V_{in}$, the output Q changes state as expected for a toggle flip-flop. The other output $Q_b$ is a faithful inverted replica of Q. FIGS. 3A–E display waveforms as in FIG. 2 but, in addition, depict the behavior of the $Q_s$ and $Q_{sb}$ nodes. Note that on each positive edge, only one of the $Q_s$ or $Q_{sb}$ nodes is activated. On each negative edge, the high-impedance node suffers a larger negative excursion than does its low-impedance counterpart; nevertheless, the negative excursion is not large enough to prevent state changes of the circuit from arising when the subsequent positive edge arrives.

A potential disadvantage of the circuit of FIG. 1 for some design contexts arises when coupling capacitors $C_1$ and $C_2$ assume undesirably high values when chosen to avoid undesired attenuation of the input signal by parasitic capacitances at the $Q_s$ and $Q_{sb}$ nodes. Any such undesirably high values of $C_1$ and $C_2$ may, in turn, lead to unnecessary switching power dissipation.

Figure 4:
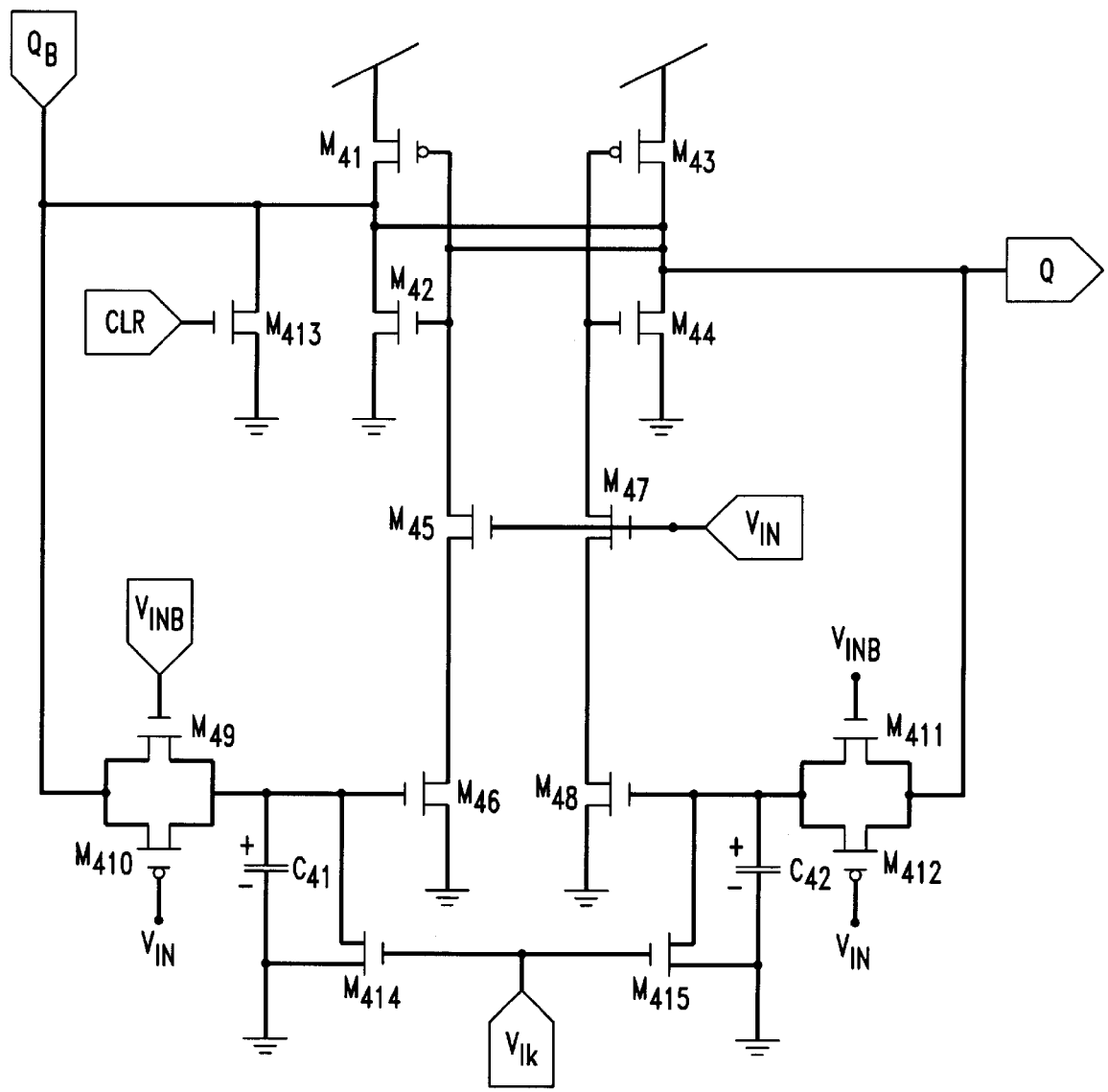
FIG. 4 is a circuit diagram of an alternative embodiment of the present invention.

FIG. 4 shows an alternative embodiment of the present invention having relatively low power dissipation because of smaller capacitances employed in its operation. This reduction in power dissipation is usually achieved using a higher transistor count and circuit area relative to the circuit of FIG. 1.

In the circuit of FIG. 4, there are no floating capacitors (all capacitors have one of their terminals tied to a D.C. voltage, typically, ground). In typical implementations, the capacitors are not explicitly implemented, but arise as parasitic capacitances. For particular very low frequency operation of the toggle flip-flop of FIG. 4, explicit capacitors may be employed, as discussed below.

In FIG. 4 transistors $M_{41}$–$M_{42}$ and $M_{43}$–$M_{44}$ form a latch as in the circuit of FIG. 1. The parallel connection of transistors $M_{49}$ and $M_{410}$, or the parallel connection of transistors $M_{411}$ and $M_{412}$ form a pass-transistor configuration. See generally, for example, J. M. Rabaey, *Digital Integrated Circuits*, Prentice-Hall, 1996, pp. 410–422. The pass-transistor configuration is gated by the voltage $V_{in}$ and its complementary counterpart $V_{inb}$ to act as a conducting switch when $V_{in}$ is low. The complementary signal $V_{inb}$ may be readily obtained by passing $V_{in}$ through a simple CMOS inverter (not shown), as will readily be appreciated by those skilled in the art.

When $V_{in}$ is high, the pass-transistor switch is turned off. Thus, the voltage at $Q_{sb}$ (the voltage on $C_{41}$) tracks the $Q_b$ voltage when $V_{in}$ is low but holds its previous value when $V_{in}$ is high. Similarly, the $Q_s$ voltage on $C_{42}$ tracks the Q voltage when $V_{in}$ is low but holds its previous value when $V_{in}$ is high. Thus, during the active high phase of the input, only one of the $Q_s$ or $Q_{sb}$ voltages is high according to whether Q or $Q_b$ was high during $V_{in}$'S preceding inactive low phase. Consequently, when $V_{in}$ goes high, only one of the $M_{45}$–$M_{46}$ or $M_{47}$–$M_{48}$ arms will conduct current and cause the latch to change its state from '0' to '1' or from '1' to '0'. The positive edge of the $V_{in}$ input, thus causes the latch to toggle its state. The Clr input on transistor $M_{413}$ resets the state of the latch to '0'.

The circuit of FIG. 4 thus operates in a manner similar to conventional master-slave toggle flip-flops, but with the important difference that functions of a slave are performed by the implicit or explicit capacitors $C_{41}$ and $C_{42}$ rather than by a second bistable element.

To ensure proper operation of the circuit for arbitrarily slow periods of the input, the capacitors $C_4$, and $C_{42}$ will be chosen large enough that their hold time is significantly greater (5–10 times) than the switching time of the latch. In that case, even if there are slow leakage currents to ground that cause degradation of the voltage values held at nodes $Q_s$ or $Q_{sb}$, such degradation does not adversely affect the operation of the circuit. This robustness of operation arises because the quick switching time of the latch allows it to change its state in a time that is much less than the time in which the $Q_s$ and $Q_{sb}$ voltages degrade. Once the latch has changed state, its positive feedback enables it to hold its new state even if the $Q_s$ and $Q_{sb}$ inputs have leaked their charge to ground.

To ensure that all leakage is to ground and not to $V_{DD}$, optional transistors $M_{414}$ and $M_{415}$ may be added across respective capacitors $C_{41}$ and $C_{42}$ to ground. Optional transistors $M_{414}$ and $M_{415}$ allow capacitor leakage to be explicitly controlled via subthreshold biasing of the (optional) $V_{lk}$ voltage, as in the circuit of FIG. 1. Since very low frequency operation is usually not important in most digital circuits, $C_{41}$ and $C_{42}$ are typically implicit capacitors, and transistors $M_{414}$ and $M_{415}$ (and voltage $V_{lk}$) are typically not required.

Figure 5A:
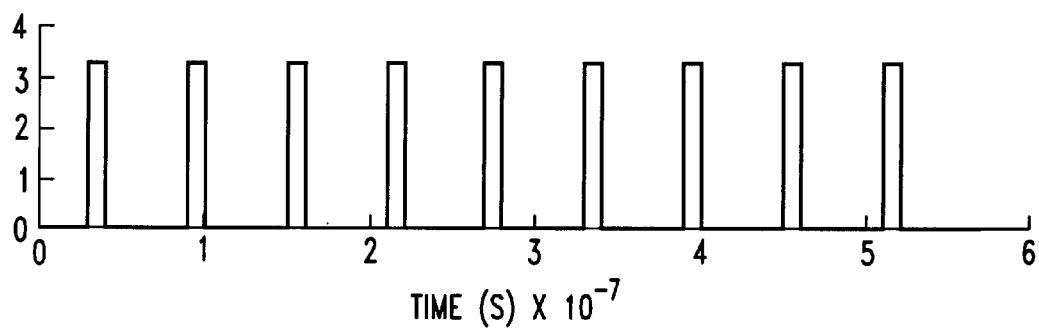
FIG. 5 shows input-output waveforms useful in understanding the operation of the circuit of FIG. 4.
Figure 5B:
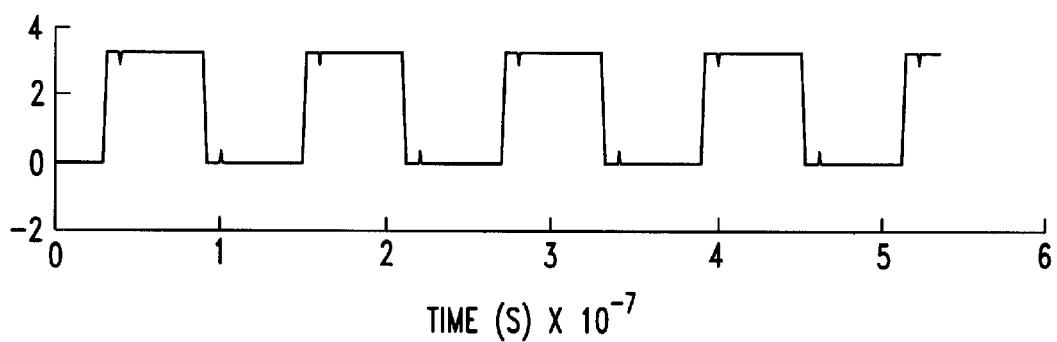
Figure 5C:
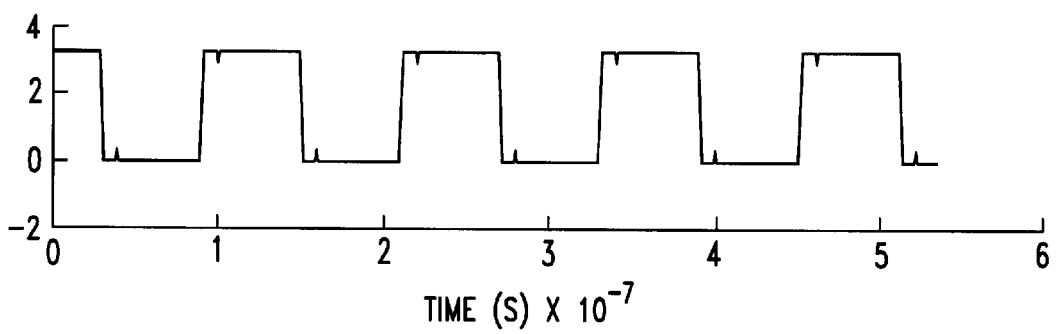
Figure 6A:
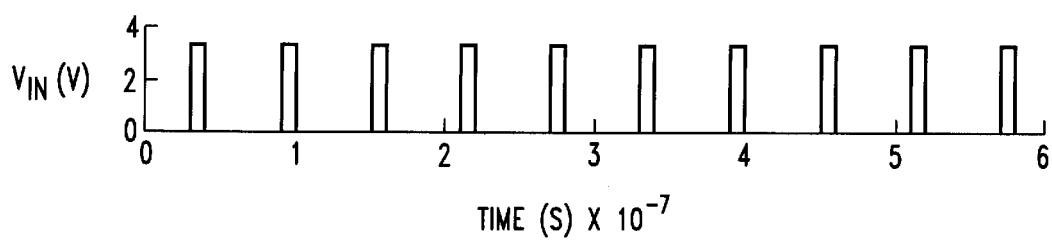
FIG. 6 shows additional waveforms relating to the circuit of FIG. 4.
Figure 6B:
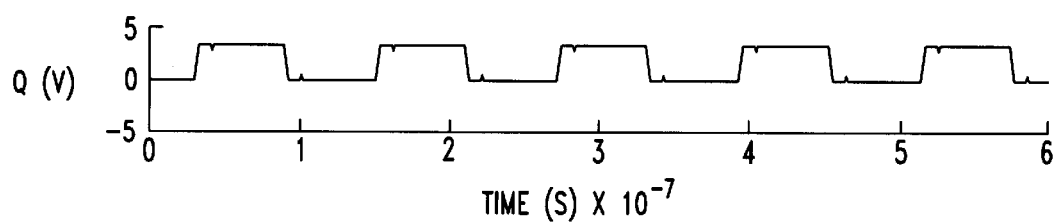
Figure 6C:
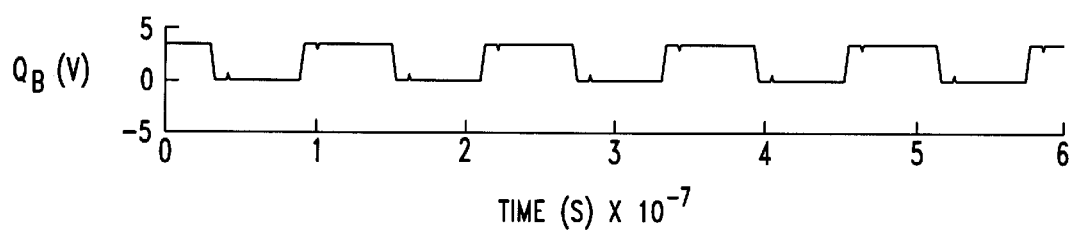
Figure 6D:
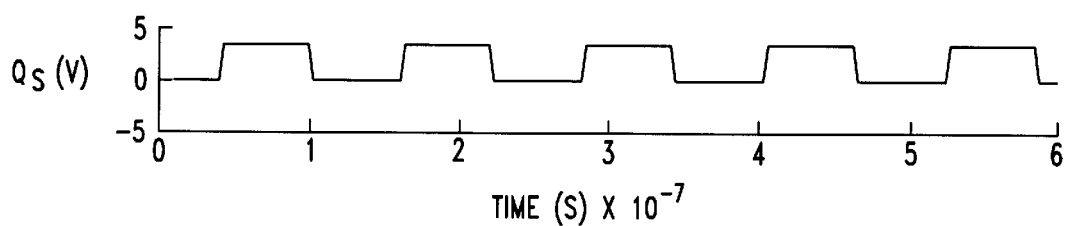
Figure 6E:
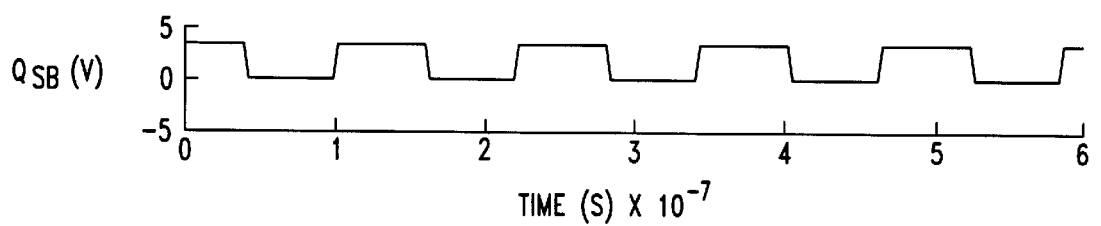

FIG. 5 shows shows typical waveforms for the circuit of FIG. 4 using a standard 0.5 µm process with $V_{DD}$=3.3V, $C_{41}$=$C_{42}$=0.01 pF, and the leak transistors $M_{414}$ and $M_{415}$ being absent. Note that, on every positive edge of the input $V_{in}$, the output Q changes state as expected of a toggle flipflop. The other output $Q_b$ is a faithful inverted replica of Q. FIG. 6 reveals the sarne waveforms of FIG. 5 and, in addition, also depicts the behavior of the $Q_s$ and $Q_{sb}$ nodes. Note that, apart from minor glitches, both $Q_s$ and $Q_{sb}$ hold their values during the active high phase of $V_{in}$, and track Q and $Q_b$ respectively during the inactive low phase of $V_{in}$.

The glitches on Q and $Q_b$ on the negative edges of $V_{in}$ arise because $Q_s$ and $Q_{sb}$ temporarily load the latch inverters as they transition from their held state to the current state. The glitches on $Q_s$ and $Q_{sb}$ during the high phase of $V_{in}$ arise because of capacitive coupling from the drains of $M_{46}$ and $M_{48}$ to their gates as $V_{in}$ rises and pulls these drains high via $M_{45}$ and $M_{47}$ respectively; the coupling is larger when $Q_s$ or $Q_{sb}$ are at high values because the gate-to-drain capacitance of $M_{46}$ or $M_{48}$ is larger when their gates are high.

It will be understood by those skilled in the art that device types, manufacturing process, polarities and parameter values used in the above-described embodiments of the present invention are merely illustrative. Other embodiments and variations within the spirit of the present invention will be apparent to those skilled in the art in light of the present inventive teachings.

Those skilled in the art will recognize that complementary circuit designs based on the present inventive teachings allow operation of circuits based on negative transitions.

What is claimed is:

1. A toggle flip-flop circuit comprising
    a bistable circuit element having first and second output terminals exhibiting respective complementary first and second binary output voltages, and
    triggering means for selectively coupling transitions of a predetermined polarity in an input signal to said bistable circuit element to initiate a change of state for said bistable circuit from a present output state to a complementary output state, said change of state causing both said first and second terminals to change binary output voltages,
    said triggering means comprising
        a first capacitor having a first terminal selectively connected to a reference voltage through a first switch controlled by the voltage on said first output of said bistable circuit element,
        a second capacitor having a first terminal selectively connected to a reference voltage through a second switch controlled by the voltage on said second output of said bistable circuit element,
        each of said first and second capacitors having a second terminal connected to said input signal, the one of said first and second switches controlled by predetermined voltage representing a predetermined binary state of said bistable circuit element connecting said transitions in said input signal to said bistable circuit element.

2. The toggle flip-flop circuit of claim 1 wherein said bistable circuit element comprises first and second inverters, each inverter having an input terminal and an output terminal, output terminals of each inverter being connected to the input terminal of the other inverter, output terminals of each of said inverters corresponding to respective ones of said output terminals of said bistable circuit element.

3. The toggle flip-flop circuit of claim 2 wherein said triggering means further comprises means for connecting the output terminal of the one of said inverters having said predetermined output voltage to said reference voltage, thereby causing said input terminal of the one of said inverters not having said predetermined output voltage to switch binary states.

4. The toggle flip-flop circuit of claim 3 wherein said means for connecting comprises a switch receiving a pulse signal corresponding to said input signal transitions of said predetermined polarity.

5. The toggle flip-flop circuit of claim 4 further comprising means for inhibiting transitions in said input signal of other than said predetermined polarity from affecting said means for connecting.

6. The toggle flip-flop circuit of claim 5, wherein said means for inhibiting comprises a transistor operating in response to a constant applied voltage to provide a connection to said reference voltage.

7. The toggle flip-flop circuit of claim 6 wherein said reference voltage is ground.

8. The toggle flip-flop circuit of claim 1 further comprising means for resetting said bistable circuit element to an initial state.

* * * * *